(12) United States Patent
Zhao et al.

(10) Patent No.: US 10,700,042 B2
(45) Date of Patent: Jun. 30, 2020

(54) MULTI-WAFER STACKING STRUCTURE AND FABRICATION METHOD THEREOF

(71) Applicant: WUHAN XINXIN SEMICONDUCTOR MANUFACTURING CO., LTD., Wuhan, Hubei (CN)

(72) Inventors: Changlin Zhao, Hubei (CN); Tian Zeng, Hubei (CN)

(73) Assignee: WUHAN XINXIN SEMICONDUCTOR MANUFACTURING CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/234,152

(22) Filed: Dec. 27, 2018

(65) Prior Publication Data
US 2020/0075549 A1    Mar. 5, 2020

(30) Foreign Application Priority Data
Aug. 28, 2018  (CN) .......................... 2018 1 0990635

(51) Int. Cl.
*H01L 21/76* (2006.01)
*H01L 25/065* (2006.01)
(Continued)

(52) U.S. Cl.
CPC .... *H01L 25/0657* (2013.01); *H01L 21/76898* (2013.01); *H01L 23/481* (2013.01); *H01L 24/08* (2013.01); *H01L 24/80* (2013.01); *H01L 25/50* (2013.01); *H01L 2224/08146* (2013.01); *H01L 2224/80895* (2013.01); *H01L 2224/80896* (2013.01); *H01L 2225/06524* (2013.01); *H01L 2225/06544* (2013.01)

(58) Field of Classification Search
CPC .......... H01L 25/0657; H01L 21/76898; H01L 23/481; H01L 24/08
USPC ........................................................ 438/622
See application file for complete search history.

(56) References Cited

U.S. PATENT DOCUMENTS

2012/0193752 A1* 8/2012 Purushothaman .......................... H01L 21/76898 257/506
2015/0054149 A1* 2/2015 Purushothaman .......................... H01L 21/76898 257/737

(Continued)

*Primary Examiner* — Sheikh Maruf
(74) *Attorney, Agent, or Firm* — Muncy, Geissler, Olds & Lowe, P.C.

(57) ABSTRACT

A multi-wafer stacking structure and fabrication method are disclosed. In the multi-wafer stacking structure, a first interconnection layer is electrically connected to a second metal layer and a first metal layer via a first opening, a second interconnection layer is electrically connected to the first interconnection layer via a second opening, a third interconnection layer is electrically connected to a third metal layer via a third opening, and the second interconnection layer is electrically connected to the third interconnection layer. It is unnecessary to reserve a bonding lead space between wafers, a silicon substrate is eliminated, and the multi-wafer stacking thickness is reduced while multi-wafer interconnection is realized, so that the overall device thickness is reduced after multi-wafer stacked package. Moreover, there is no need of leads, so as to eliminate design processing of a silicon substrate and a plurality of shared bonding pads on the silicon substrate.

7 Claims, 8 Drawing Sheets

(51) Int. Cl.
    *H01L 25/00*     (2006.01)
    *H01L 23/00*     (2006.01)
    *H01L 23/48*     (2006.01)
    *H01L 21/768*     (2006.01)

(56) References Cited

U.S. PATENT DOCUMENTS

| | | | |
|---|---|---|---|
| 2015/0318246 A1* | 11/2015 | Yu | H01L 23/00 257/774 |
| 2015/0318263 A1* | 11/2015 | Yu | H01L 23/3157 257/774 |
| 2015/0380385 A1* | 12/2015 | Hsu | H01L 23/481 257/774 |
| 2016/0020170 A1* | 1/2016 | Ho | H01L 24/91 257/774 |
| 2016/0268230 A1* | 9/2016 | Lin | H01L 23/5329 |
| 2016/0351546 A1* | 12/2016 | Tsai | H01L 21/31051 |
| 2017/0053902 A1* | 2/2017 | Yu | H01L 25/105 |
| 2017/0117253 A1* | 4/2017 | Yu | H01L 25/0657 |
| 2018/0053730 A1* | 2/2018 | Shao | H01L 24/92 |
| 2018/0068984 A1* | 3/2018 | Beyne | H01L 25/0657 |
| 2019/0013295 A1* | 1/2019 | Wu | H01L 24/06 |

\* cited by examiner

MULTI-WAFER STACKING STRUCTURE AND FABRICATION METHOD THEREOF

CROSS-REFERENCE TO RELATED APPLICATION

This application claims the priority of Chinese patent application number 201810990635.9, filed on Aug. 28, 2018, the entire contents of which are incorporated herein by reference.

TECHNICAL FIELD

The present invention belongs to the technical field of manufacturing of integrated circuits, and in particular, to a multi-wafer stacking structure and a fabrication method thereof.

BACKGROUND

Under the tendency of development of highly integrated semiconductors, after multi-wafer stacking, a manner of lead bonding is generally adopted to realize interconnection among multiple wafers. Specifically, multiple wafers are stacked along a vertical direction on a special silicon substrate. Each wafer has multiple bonding pads used for interconnection, a plurality of sharing bonding pads are arranged on the silicon substrate. One end of each of leads is bonded to a corresponding one of the bonding pads of the wafer in a pressure welding manner, and the other end of each of the leads are bonded to a corresponding one of the sharing bonding pads of the silicon substrate in an integrated pressure welding manner, so as to realize interconnection among the multiple wafers.

But the inventor finds that some problems exist in the traditional multi-wafer lead interconnection manner. Firstly, there are certain restrictions on the thickness of the wafers with the development of multi-wafer stacking towards high density. As a pressure welding lead space needs to be reserved among multiple wafers adopting lead bonding, the silicon substrate itself has a certain thickness, and the overall thickness after multi-wafer stacking is relatively great to a certain extent. In addition, gold wires are generally adopted as the leads, and therefore, the cost is relatively high. Moreover, the leads result in a relatively long interconnection line, which reduces the signal transmission speed and increases the power loss. Furthermore the silicon substrate cannot be adapted to the requirement on more and more sharing bonding pads for high-density development of the multi-wafer stacking.

SUMMARY OF THE INVENTION

The present invention is directed to a multi-wafer stacking structure, intended to reduce the overall thickness after multi-wafer stacking.

The present invention is also directed to no need of leads, thereby improving the signal transmission speed and reducing the power loss.

In order to solve the foregoing technical problems, the present invention provides a multi-wafer stacking structure, including:

a first wafer, the first wafer including a first substrate, a first dielectric layer, a first metal layer, and a first isolated layer located at a back of the first substrate;

a second wafer, the second wafer including a second substrate, a second dielectric layer and a second metal layer, the first dielectric layer being bonded to the second dielectric layer;

a first opening, wherein the first opening includes a first upper opening, a first middle opening and a first lower opening; the first upper opening penetrates through a partial thickness of the first isolated layer, the first middle opening penetrates through the first isolated layer, the first substrate and a partial thickness of the first dielectric layer and is located above the first metal layer, the first lower opening penetrates through the first wafer and a partial thickness of the second dielectric layer and is located above the second metal layer, and the first upper opening is communicated with the first middle opening and the first lower opening respectively;

a second isolated layer, the second isolated layer covering the surface of the first isolated layer and the surface of the first opening and exposing part of the first metal layer and part of the second metal layer;

a first interconnection layer, the first interconnection layer being electrically connected to the first metal layer and the second metal layer via the first opening;

an insulating layer, the insulating layer being located on the surfaces of the second isolated layer and the first interconnection layer;

a second opening, wherein the second opening penetrates through the insulating layer, and the second opening is located above the first interconnection layer and exposing a partial thickness of the first interconnection layer;

a third wafer, the third wafer including a third substrate, a third dielectric layer and a third metal layer;

a third opening, wherein the third opening penetrates through a partial thickness of the third dielectric layer and exposes a partial thickness of the third metal layer, and the third opening and the second opening are arranged correspondingly;

a second interconnection layer, the second interconnection layer being electrically connected to the first interconnection layer via the second opening; and a third interconnection layer, the third interconnection layer being electrically connected to the third metal layer via the third opening, and the second interconnection layer being electrically connected to the third interconnection layer.

The present invention also provides a method for fabricating a multi-wafer stacking structure, including:

providing a first wafer and a second wafer, the first wafer including a first substrate, a first dielectric layer, a first metal layer, and a first isolated layer located at a back of the first substrate, the second wafer including a second substrate, a second dielectric layer and a second metal layer, and the first dielectric layer being bonded to the second dielectric layer;

forming a first opening, the first opening including a first upper opening, a first middle opening and a first lower opening, the first upper opening penetrating through a partial thickness of the first isolated layer, the first middle opening penetrating through the first isolated layer, the first substrate and a partial thickness of the first dielectric layer and being located above the first metal layer, the first lower opening penetrating through the first wafer and a partial thickness of the second dielectric layer and being located above the second metal layer, and the first upper opening being communicated with the first middle opening and the first lower opening respectively;

forming a second isolated layer, the second isolated layer covering the surface of the first isolated layer and the surface of the first opening and exposing part of the first metal layer and part of the second metal layer;

forming a first interconnection layer, the first interconnection layer being electrically connected to the first metal layer and the second metal layer via the first opening;

forming an insulating layer, the insulating layer being located on the surface of the second isolated layer and the surface of the first interconnection layer, and forming a second opening in the insulating layer, the second opening exposing part of the first interconnection layer;

providing a third wafer, the third wafer including a third substrate, a third dielectric layer and a third metal layer;

forming a third opening, the third opening penetrating through a partial thickness of the third dielectric layer and exposing a partial thickness of the third metal layer, and the third opening and the second opening being arranged correspondingly;

forming a second interconnection layer and a third interconnection layer, the second interconnection layer being electrically connected to the first interconnection layer via the second opening, and the third interconnection layer being electrically connected to the third metal layer via the third opening; and bonding the first wafer and the third wafer, so that the second interconnection layer is electrically connected to the third interconnection layer to realize interconnection of the first wafer, the second wafer and the third wafer.

In the multi-wafer stacking structure and method provided by the present invention, a first interconnection layer is electrically connected to a first metal layer and a second metal layer via a first opening, a second interconnection layer is electrically connected to the first interconnection layer via a second opening, a third interconnection layer is electrically connected to a third metal layer via a third opening, and the second interconnection layer is in contact with the third interconnection layer. It is unnecessary to reserve a bonding lead space between wafers, a silicon substrate is eliminated, and the multi-wafer stacking thickness is reduced while multi-wafer interconnection is realized, so that the overall device thickness is reduced after multi-wafer stacked package, the package density is increased, and the requirements for increasingly thinning semiconductor products are met. Moreover, there is no need of leads for the multi-wafer stacking structure, so as to eliminate design processing of a silicon substrate and a plurality of shared bonding pads on the silicon substrate, thereby facilitating cost reduction and process simplification. In addition, the second interconnection layer is in contact with the third interconnection layer to shorten an interconnection distance between wafers, thus reducing the parasitic capacitance and the power loss, and improving the transmission speed.

The reference numerals are as follows:

10—first wafer; 101—first substrate; 102—first dielectric layer; 103—first metal layer; 104—first etch stop layer; 102a—first portion of the first dielectric layer; 102b—second portion of the first dielectric layer; 105—first isolated layer; 106—second isolated layer; 107—insulating layer; 108—passivation layer;

20—second wafer; 201—second substrate; 202—second dielectric layer; 203—second metal layer; 204—second etch stop layer; 202a—first portion of the second dielectric layer; 202b—second portion of the second dielectric layer; 205—passivation layer;

30—third wafer; 301—third substrate; 302—third dielectric layer; 303—third metal layer; 304—third etch stop layer; 302a—first portion of the third dielectric layer; 302b—second portion of the third dielectric layer; 305—passivation layer;

41—first bonding interface; 42—second bonding interface;

51—first opening; 51a—first upper opening; 51b—first middle opening; 51c—first lower opening; 52—second opening; 53—third opening;

61—photoresist; 62—photoresist;

71—first interconnection layer; 72—second interconnection layer; 73—third interconnection layer.

DETAILED DESCRIPTION OF EXEMPLARY EMBODIMENTS

The multi-wafer stacking structure and method proposed by the present invention are further described in detail below with reference to the accompanying drawings and specific embodiments. The advantages and features of the present invention will be clearer according to the following description. It is to be noted that the accompanying drawings are in a very simple form and in a non-accurate proportion, and are only for the purpose of conveniently and clearly supporting the description of the present invention.

Figure 1:
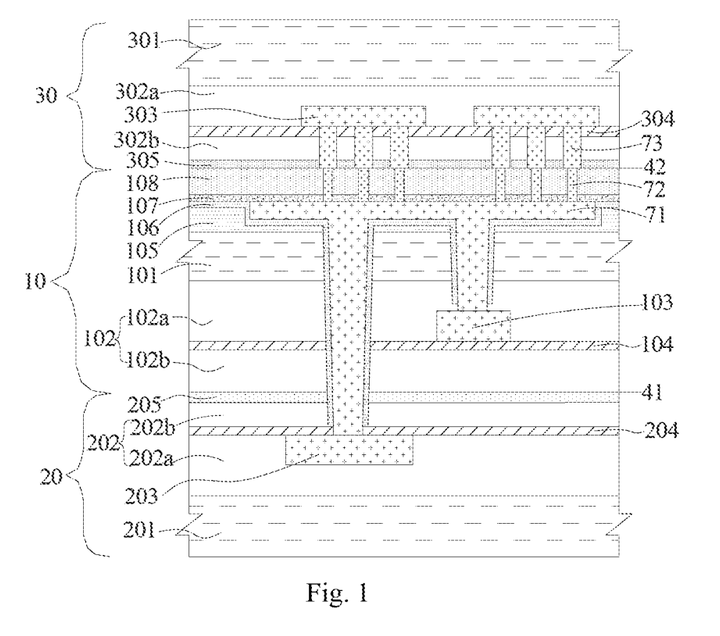
FIG. 1 is a sectional schematic diagram of a multi-wafer stacking structure according to an embodiment of the present invention.
Figure 7:
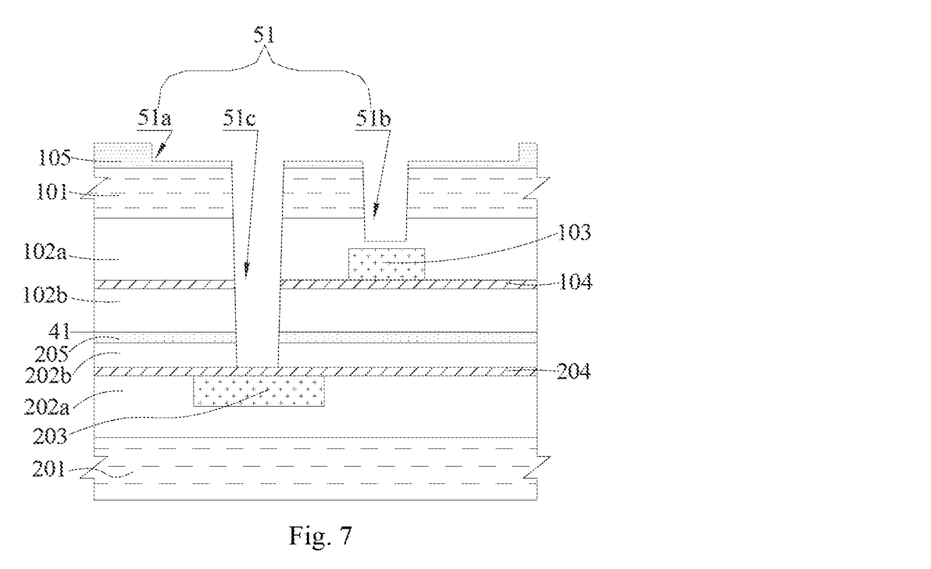
FIG. 7 is a sectional schematic diagram after forming a first lower opening according to an embodiment of the present invention.
Figure 12:
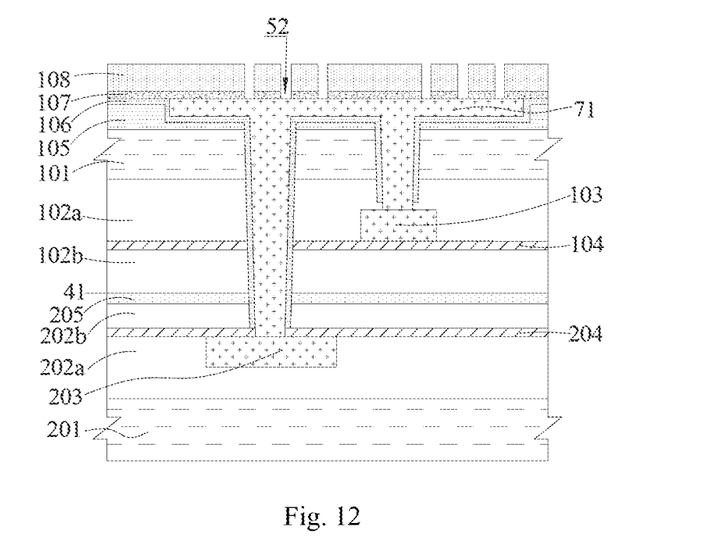
FIG. 12 is a sectional schematic diagram after forming a second opening according to an embodiment of the present invention.
Figure 13:
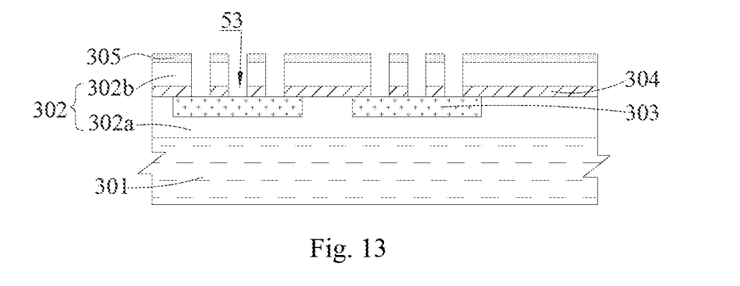
FIG. 13 is a sectional schematic diagram after forming a third opening of a third wafer according to an embodiment of the present invention.

The multi-wafer stacking structure provided by the embodiment of the present invention is introduced in detail below as shown in FIG. 1, FIG. 7, FIG. 12 and FIG. 13. A multi-wafer stacking structure includes:

a first wafer 10, wherein the first wafer 10 includes a first substrate 101, a first dielectric layer 102 located on the first substrate 101, a first metal layer 103 embedded in the first dielectric layer 102, and a first isolated layer 105 located at the back of the first substrate 101;

a second wafer 20, wherein the second wafer 20 includes a second substrate 201, a second dielectric layer 202 located on the second substrate 201, a second metal layer 203 embedded in the second dielectric layer 202, wherein the first dielectric layer 102 is bonded to the second dielectric layer 202;

a first opening 51, as shown in FIG. 7, wherein the first opening 51 includes a first upper opening 51a, a first middle opening 51b and a first lower opening 51c. The first upper opening 51a penetrates through a partial thickness of the first isolated layer 105. The first middle opening 51b penetrates through the first isolated layer 105, the first substrate 101 and a partial thickness of the first dielectric layer 102. The first middle opening 51b is located above the first metal layer 103. The first lower opening 51c penetrates through the first wafer 10 and a partial thickness of the second dielectric layer 202. The first lower opening 51c is located above the second metal layer 203. The first upper opening 51a is communicated with the first middle opening 51b and the first lower opening 51c respectively;

a second isolated layer 106, wherein the second isolated layer 106 covers the surface of the first isolated layer 105 and the surface of the first opening 51 and exposes (at least) part of the first metal layer 103 and (at least) part of the second metal layer 203 by a subsequent etch process;

a first interconnection layer 71, wherein the first interconnection layer 71 is electrically connected to the first metal layer 103 and the second metal layer 203 via the first opening 51;

an insulating layer 107, wherein the insulating layer 107 is located on the surfaces of the second isolated layer 106 and the first interconnection layer 71;

a second opening 52, as shown in FIG. 12, wherein the second opening 52 penetrates through the insulating layer 107, and the second opening 52 is located above the first interconnection layer 71 and exposes part of the first interconnection layer 71;

a third wafer 30, wherein the third wafer 30 includes a third substrate 301, a third dielectric layer 302 and a third metal layer 303;

a third opening 53, as shown in FIG. 13, wherein the third opening 53 penetrates through a partial thickness of the third dielectric layer 302 and exposes part of the third metal layer 303, and wherein the third opening 53 and the second opening 52 are arranged correspondingly;

a second interconnection layer 72, wherein the second interconnection layer 72 is electrically connected to the first interconnection layer 71 via the second opening 52; and a third interconnection layer 73, wherein the third interconnection layer 73 is electrically connected to the third metal layer 303 via the third opening 53, and wherein the second interconnection layer 72 is in contact with the third interconnection layer 73.

In order to reduce the overall thickness after multi-wafer stacked interconnection, the first substrate 101 and/or the second substrate 201 may be thinned after the first dielectric layer 102 and the second dielectric layer 202 are bonded to each other. The third substrate 301 may be thinned after the first wafer 10 and the third wafer 30 are bonded.

Preferably, as shown in FIG. 12 and FIG. 13, each second opening 52 and each third opening 53 respectively include multiple holes distributed at intervals, that is, each second opening 52 and each third opening 53 are array hole groups consisting of multiple holes. In the multiple holes distributed at intervals, the second interconnection layer 72 is in contact with the third interconnection layer 73, thereby increasing the interconnection reliability. Meanwhile, the interval distribution reduces heat generated in the operation of the interconnection layers. Moreover, multiple holes distributed at intervals may be made in smaller size and larger density, so that the demands for interconnection of some products for specific purposes can also be met. For example, it is required that a signal led out for interconnection is a high-density and low-current signal, and corresponding holes and interconnection layers in the holes are smaller in size and larger in density.

Preferably, as shown in FIG. 1, the first dielectric layer 102 includes a first portion 102a and a second portion 102b. The first metal layer 103 is embedded between the first portion 102a and the second portion 102b of the first dielectric layer 102. The second dielectric layer 202 includes a first portion 202a and a second portion 202b. The second metal layer 203 is embedded between the first portion 202a and the second portion 202b of the second dielectric layer 202.

Preferably, the first wafer 10 further includes a first etch stop layer 104. The first etch stop layer 104 is located between the first metal layer 103 and the second portion 102b of the first dielectric layer. The second wafer 20 further includes a second etch stop layer 204. The second etch stop layer 204 is located between the second metal layer 203 and the second portion 202b of the second dielectric layer.

Preferably, the first wafer 10 further includes a passivation layer 108. The passivation layer 108 covers the surface of the insulating layer 107. The second wafer 20 further includes a passivation layer 205. The passivation layer 205 covers the surface of the second dielectric layer 202. The second wafer 30 further includes a passivation layer 305. The passivation layer 305 covers the surface of the third dielectric layer 302. The passivation layers of the three wafers are, e.g., silicon oxide layers and/or silicon nitride layers for protecting the surfaces of the wafers.

Figure 2:
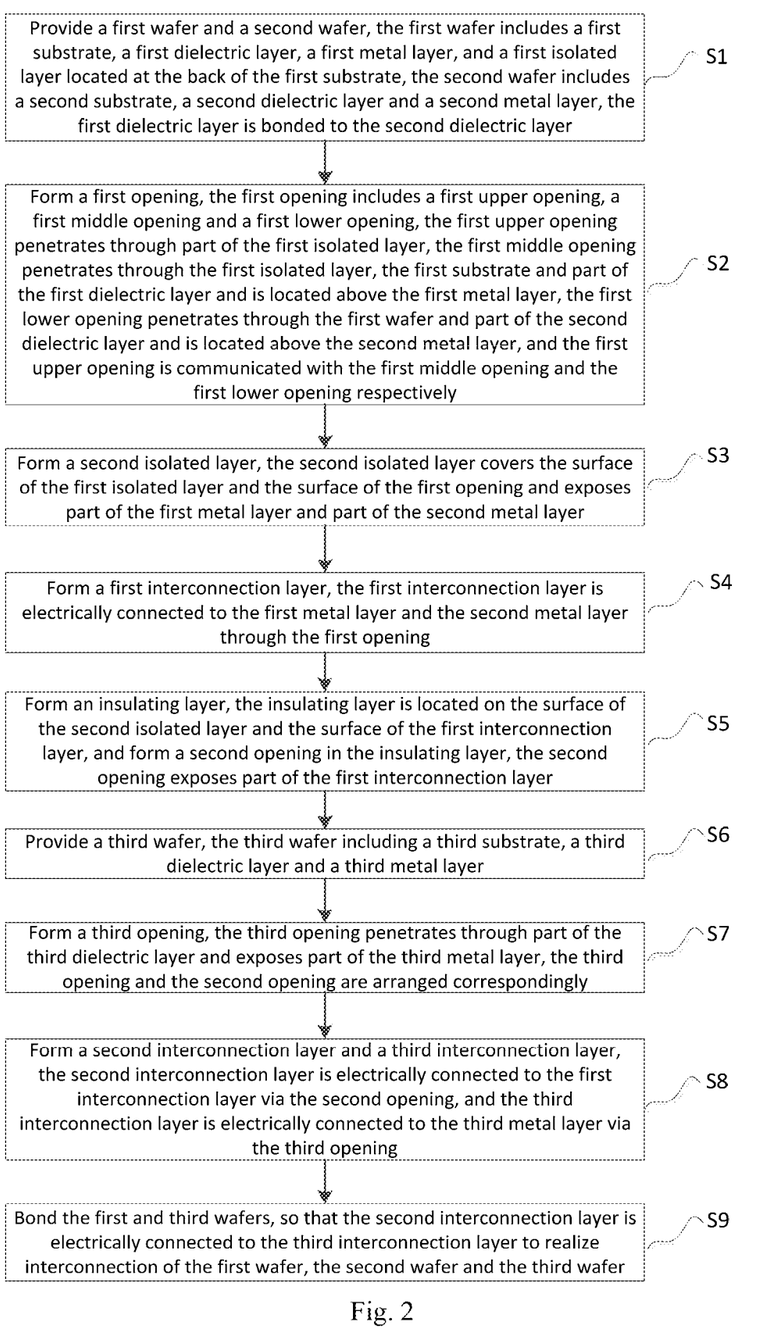
FIG. 2 is a flowchart of a method for fabricating a multi-wafer stacking structure according to an embodiment of the present invention.

As shown in FIG. 2, a method for fabricating a multi-wafer stacking structure provided by an embodiment of the present invention includes the following steps:

Provide a first wafer 10 and a second wafer 20. Wherein the first wafer 10 includes a first substrate 101, a first dielectric layer 102 located on the first substrate 101, a first metal layer 103 embedded in the first dielectric layer 102, and a first isolated layer 105 located at the back of the first substrate 101. The second wafer 20 includes a second substrate 201, a second dielectric layer 202 located on the second substrate 201 and a second metal layer 203 embedded in the second dielectric layer 202. And the first dielectric layer 102 is bonded to the second dielectric layer 202.

Form a first opening 51, wherein the first opening 51 includes a first upper opening 51a, a first middle opening 51b and a first lower opening 51c. The first upper opening 51a penetrates through a partial thickness of the first isolated layer 105. The first middle opening 51b penetrates through the first isolated layer 105, the first substrate 101 and a partial thickness of the first dielectric layer 102. And the first middle opening 51b is located above the first metal layer 103. The first lower opening 51c penetrates through the first wafer 10 and a partial thickness of the second dielectric layer 202. The first lower opening 51c is located above the second metal layer 203, and the first upper opening 51a is communicated with the first middle opening 51b and the first lower opening 51c respectively.

Form a second isolated layer 106, wherein the second isolated layer 106 covers the surface of the first isolated layer 105 and the surface of the first opening 51. The second isolated layer 106 exposes part of the first metal layer 103 and part of the second metal layer 203 by a subsequent etch process.

Form a first interconnection layer 71, wherein the first interconnection layer 71 is electrically connected to the first metal layer 103 and the second metal layer 203 via the first opening 51.

Form an insulating layer 107, wherein the insulating layer 107 is located on the surface of the second isolated layer 106 and the surface of the first interconnection layer 71. And form a second opening 52 in the insulating layer 107, the second opening 52 exposing part of the first interconnection layer 71.

Provide a third wafer 30, wherein the third wafer 30 includes a third substrate 301, a third dielectric layer 302 and a third metal layer 303.

Form a third opening 53, wherein the third opening 53 penetrates through a partial thickness of the third dielectric layer 302 and exposes part of the third metal layer 303. The third opening 53 and the second opening 52 are arranged correspondingly.

Form a second interconnection layer 72 and a third interconnection layer 73. Wherein the second interconnection layer 72 is electrically connected to the first interconnection layer 71 via the second opening 52. The third interconnection layer 73 is electrically connected to the third metal layer 303 via the third opening 53.

Bond the first wafer 10 and the third wafer 30, so that the second interconnection layer 72 is in contact with the third interconnection layer 73 to realize interconnection of the first wafer 10, the second wafer 20 and the third wafer 30.

The present invention does not limit that the first wafer or the second wafer must be put above/below, but the positions of the upper and lower wafers can be exchanged. For brief and convenient description, only one positional relationship between the two wafers is shown herein. Those skilled in the art can understand that all technical contents described herein are also applicable to the case where the positions of "first wafer" and "second wafer" are inverted. In this case, all layers of a stacked semiconductor device are also in an inverted positional relationship correspondingly. In some cases, preferably, during the bonding of the two wafers, the wafer with a large bow is put below. However, in this case, after the wafers are bonded completely, it may also be determined whether to invert according to practical demands, so as to determine the positions of the wafers.

It is to be noted that serial numbers such as "first", "second", "third", and "fourth" are only for distinguishing various different components or processes with the same name, and do not mean a sequence or a positional relationship, etc. In addition, various different components with the same name such as "first substrate" and "second substrate", "first dielectric layer" and "second dielectric layer", do not mean that they have the same structure or component. For example, although not shown in the figure, components formed in "first substrate" and "second substrate" are different, and the substrates may also be different structurally. In some implementations, the substrate may be a semiconductor substrate, made of any semiconductor material (such as Si, SiC and SiGe) suitable for a semiconductor device. In some other implementations, the substrate may also be various composite substrates such as a silicon on insulator (SOI) or a silicon germanium on insulator. Those skilled in the art may understand that substrates may be selected according to practical applications without any limitation. Various device (not limited to a semiconductor device) components (not shown in the figure) may be formed in the substrate. The substrate may also have been formed with other layers or members such as a gate structure, a contact hole, a dielectric layer, a metal wire or a through hole.

The fabrication method provided by the embodiment of the present invention is introduced in detail below as shown in FIG. 3 to FIG. 15.

Figure 3:
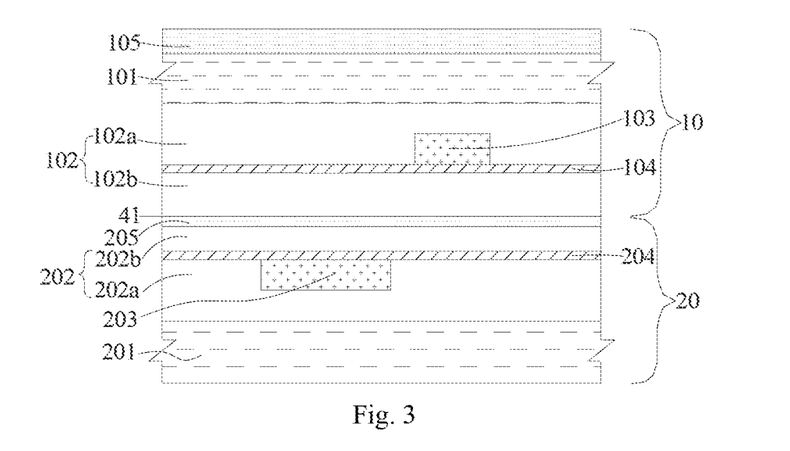
FIG. 3 is a schematic diagram after bonding two wafers according to an embodiment of the present invention.

Firstly, as shown in FIG. 3, a first wafer 10 and a second wafer 20 that are bonded are provided. The first wafer 10 includes a first substrate 101, a first dielectric layer 102 located on the first substrate 101, and a first metal layer 103 embedded in the first dielectric layer 102.

The second wafer 20 includes a second substrate 201, a second dielectric layer 202 located on the second substrate 201, and a second metal layer 203 embedded in the second dielectric layer 202. The first dielectric layer 102 faces the second dielectric layer 202, and two wafers may be bonded using an intermolecular chemical force of a bonding interface film to form a first bonding interface 41.

In order to reduce the overall thickness after multi-wafer stacked interconnection, the first substrate 101 and/or the second substrate 201 may be thinned after the first dielectric layer 102 and the second dielectric layer 202 are bonded to each other, and then a first isolated layer 105 is formed at the back of the first substrate 101. The first isolated layer 105 is, e.g., a silicon oxide layer with good compactness, so that the first substrate 101 is isolated from the external environment to achieve a good protection effect.

Further, the first dielectric layer 102 includes a first portion 102a and a second portion 102b. The first metal layer 103 is embedded between the first portion 102a and the second portion 102b of the first dielectric layer 102. The second dielectric layer 202 includes a first portion 202a and a second portion 202b. The second metal layer 203 is embedded between the first portion 202a and the second portion 202b of the second dielectric layer 202.

In a preferred solution, the first wafer 10 further includes a first etch stop layer 104. The first etch stop layer 104 is located between the first metal layer 103 and the second portion 102b of the first dielectric layer 102. The second wafer 20 further includes a second etch stop layer 204. The second etch stop layer 204 is located between the second metal layer 203 and the second portion 202b of the second dielectric layer 202.

The second wafer 20 may further include a passivation layer 205 located on the surface of the second dielectric layer second portion 202b. The passivation layer 205 is, e.g., a silicon oxide layer and/or a silicon nitride layer for protecting the surface of the wafer. In the present embodiment, the passivation layer 205 is in contact with the second portion 102b of the first dielectric layer 102, thus forming a first bonding interface 41.

Figure 4:
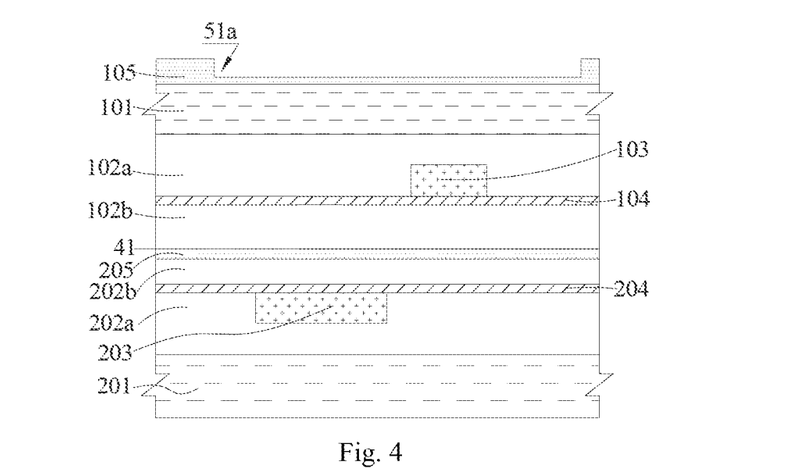
FIG. 4 is a sectional schematic diagram after forming a first upper opening according to an embodiment of the present invention.

Then, as shown in FIG. 4, a first upper opening 51a is formed by etching. The first upper opening 51a penetrates through a partial thickness of the first isolated layer 105. The first upper opening 51a is located above the first metal layer 103 and the second metal layer 203.

Figure 5A:
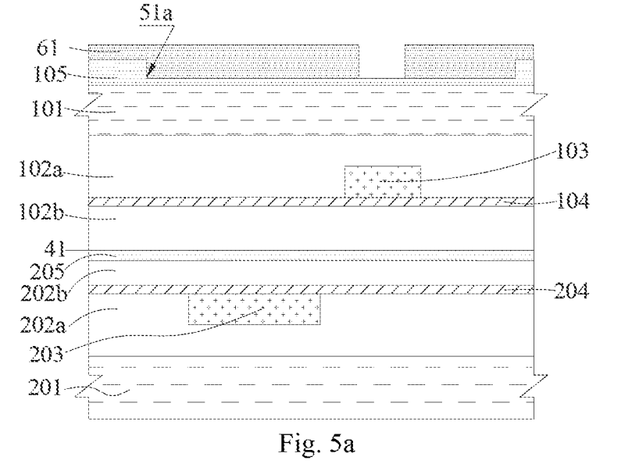
FIG. 5a is a sectional schematic diagram after forming a patterned photoresist according to an embodiment of the present invention.
Figure 5B:
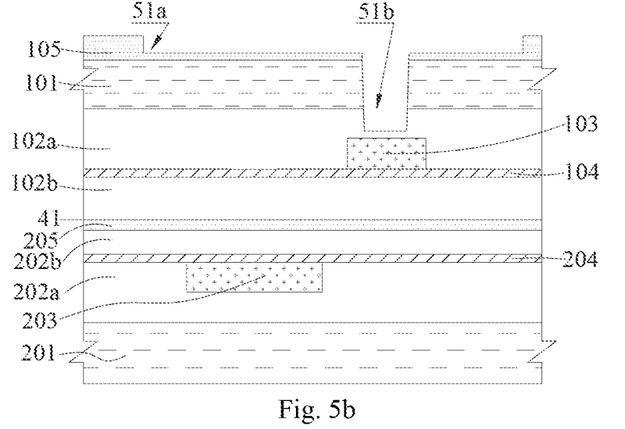
FIG. 5b is a sectional schematic diagram after forming a first middle opening according to an embodiment of the present invention.

Then, as shown in FIG. 5a and FIG. 5b, a first middle opening 51b is formed. A photoresist 61 with good fluidity is filled in the first upper opening 51a, and covers the surface of the first isolated layer 105. A patterned photoresist is formed by exposure and development, the patterned photoresist having a photoresist window located above the first metal layer 103. A first middle opening 51b is formed by etching with the patterned photoresist serving as a mask. The first middle opening 51b penetrates through the first isolated layer 105, the first substrate 101 and a partial thickness of the first dielectric layer 102. The first middle opening 51b is located above the first metal layer 103. Then, the patterned photoresist is removed.

Figure 6:
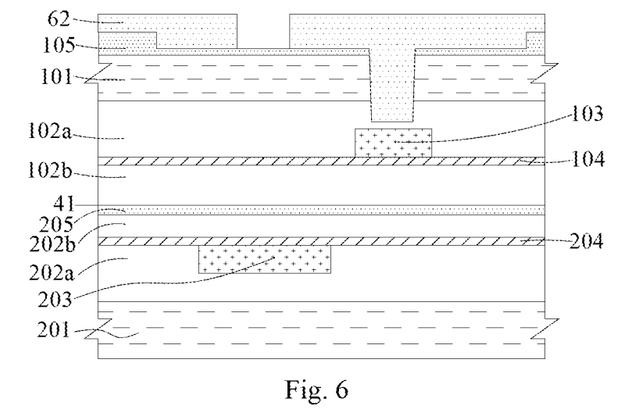
FIG. 6 is a sectional schematic diagram after forming a photoresist according to an embodiment of the present invention.

Afterward, as shown in FIG. 6 and FIG. 7, a first lower opening 51c is formed. A photoresist 62 with good fluidity and filling property is filled in the first upper opening 51a and the first middle opening 51b, and covers the surface of the first isolated layer 105. A patterned photoresist 62 is formed by exposure and development. The patterned photoresist 62 has a photoresist window located above the second metal layer 203. A first lower opening 51c is formed by etching with the patterned photoresist serving as a mask. The first lower opening 51c penetrates through the first wafer 10 and a partial thickness of the second dielectric layer 202. The first lower opening 51c is located above the second metal layer 203. Then, the patterned photoresist is removed. The first upper opening 51a is communicated with the first middle opening 51b and the first lower opening 51c respectively, so as to form the first opening 51.

Figure 8:
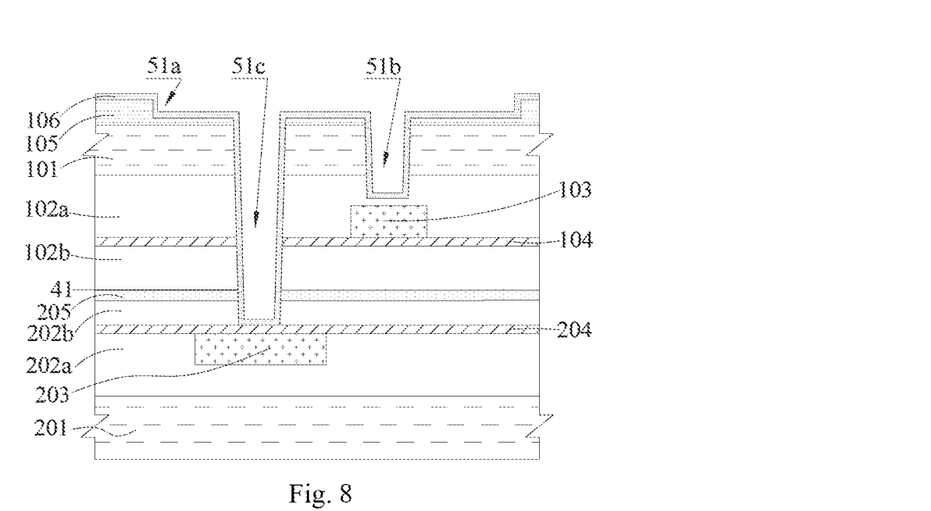
FIG. 8 is a sectional schematic diagram after forming a second isolated layer according to an embodiment of the present invention.
Figure 9:
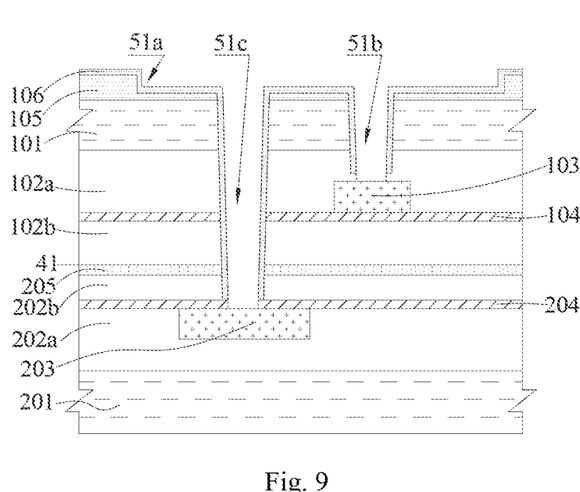
FIG. 9 is a sectional schematic diagram after exposing a first metal layer and a second metal layer according to an embodiment of the present invention.

Afterward, as shown in FIG. 8 and FIG. 9, a second isolated layer 106 is formed. The second isolated layer 106 covers the surface of the first isolated layer 105 and the surface of the first opening 51 may be formed by selecting a deposition manner for protecting the side wall of the first wafer 10 and the side wall of part of the second dielectric layer 202 which are exposed from the first lower opening 51c. The second isolated layer 106 is, e.g., a silicon oxide layer. Then, an etch process is performed to etch away the second isolated layer 106 and part of the first dielectric layer 102 at the bottom of the first middle opening 51b and expose the first metal layer 103. And at the same time, the second isolated layer 106 and the second etch stop layer 204 at the bottom of the first lower opening 51c are etched so as to expose the second metal layer 203.

Figure 10:
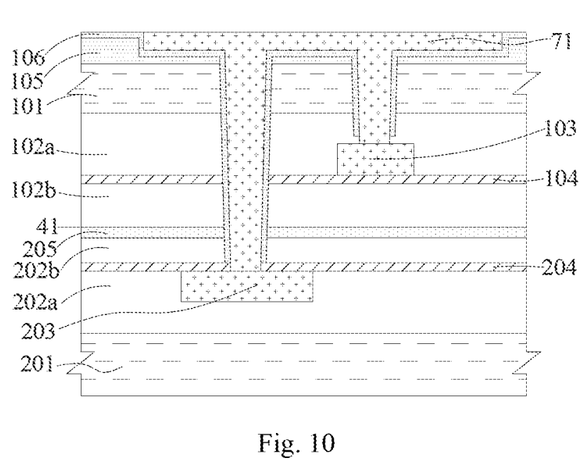
FIG. 10 is a sectional schematic diagram after forming a first interconnection layer according to an embodiment of the present invention.

Then, as shown in FIG. 10, a first interconnection layer 71 is formed. The first interconnection layer 71 is electrically connected to the first metal layer 103 and the second metal layer 203 via the first opening 51. The first interconnection layer 71 is a conductive material which may be copper or copper alloy. The first opening 51 may be filled in an electrocoppering manner, and the surface of the second isolated layer 106 is covered. The first interconnection layer 71 on the surface of the second isolated layer 106 is removed by chemical mechanical polishing, and the first interconnection layer 71 at the top of the first opening 51 is flattened.

Figure 11:
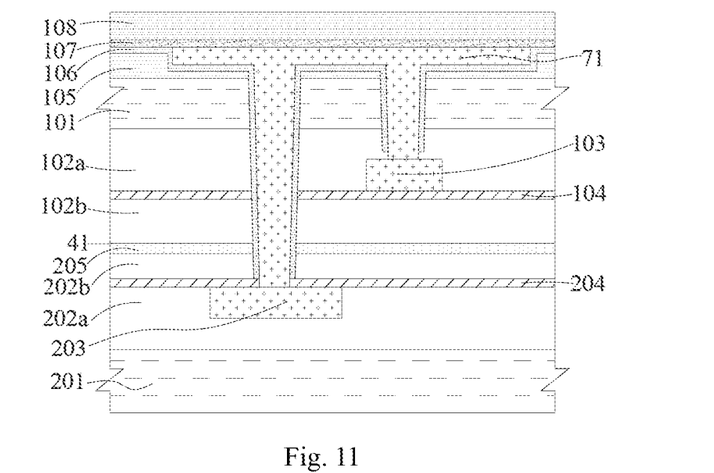
FIG. 11 is a sectional schematic diagram after forming an insulating layer according to an embodiment of the present invention.

Then, as shown in FIG. 11, an insulating layer 107 is formed. The insulating layer 107 is located on the surfaces of the second isolating layer 106 and the first interconnection layer 71. Preferably, the surface of the insulating layer 107 forms a passivation layer 108. The passivation layer 108 is, e.g., a silicon oxide layer and/or a silicon nitride layer for protecting the surface of the first wafer 10.

Then, as shown in FIG. 12, a second opening 52 is formed. The second opening 52 penetrates through the passivation layer 108 and the insulating layer 107. The second opening 52 exposes part of the first interconnection layer 71.

Then, as shown in FIG. 13, a third wafer 30 is provided. The third wafer 30 includes a third substrate 301, a third dielectric layer 302 located on the third substrate 301, and a third metal layer 303 embedded in the third dielectric layer 302. Further, the third dielectric layer 302 includes a first portion 302a and a second portion 302b. The third metal layer 303 is embedded between the first portion 302a and the second portion 302b of the third dielectric layer 302. In a preferred solution, the third wafer 30 further includes a third etch stop layer 304. The third etch stop layer 304 is located between the third metal layer 303 and the second portion 302b of the third dielectric layer 302. A passivation layer 305 is formed on the surface of the third dielectric layer 302. The passivation layer 305 is, e.g., a silicon oxide layer and/or a silicon nitride layer for protecting the surface of the wafer.

Then, referring to FIG. 13 again, a third opening 53 is formed. The third opening 53 penetrates through the passivation layer 305, the third dielectric layer second portion 302b and the third etch stop layer 304. The third opening 53 exposes part of the third metal layer 303, and the third opening 53 corresponds to the second opening 52.

Figure 14:
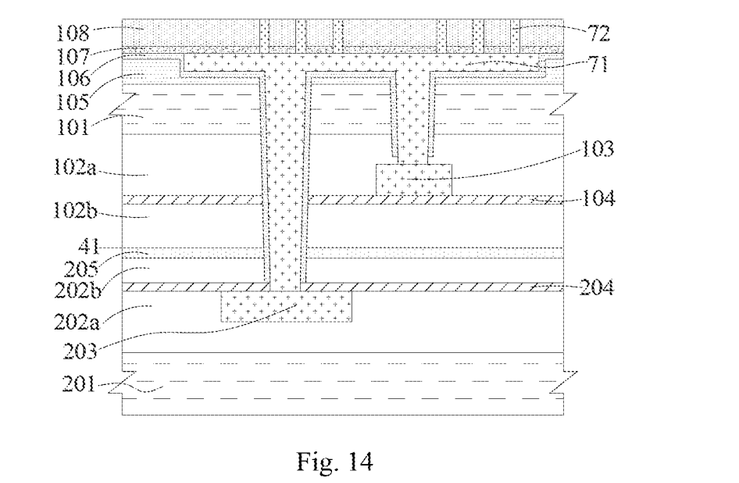
FIG. 14 is a sectional schematic diagram after forming a second interconnection layer in a second opening according to an embodiment of the present invention.
Figure 15:
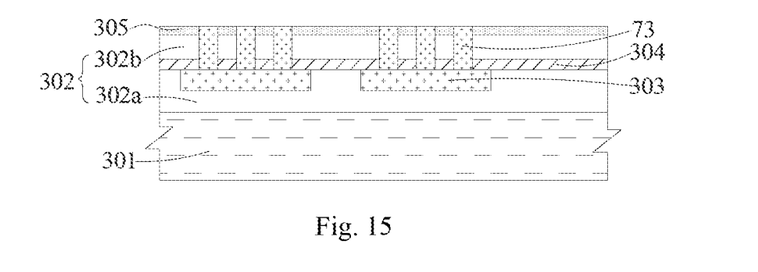
FIG. 15 is a sectional schematic diagram after forming a third interconnection layer in a third opening of a third wafer according to an embodiment of the present invention.

Then, as shown in FIG. 14 and FIG. 15, a second interconnection layer 72 and a third interconnection layer 73 are formed. The second interconnection layer 72 is electrically connected to the first interconnection layer 71 via the second opening 52. The third interconnection layer 73 is electrically connected to the third metal layer 303 through the third opening 53.

Preferably, each second opening 52 and each third opening 53 respectively include multiple holes distributed at intervals, that is, each second opening 52 and each third opening 53 are array hole groups consisting of multiple holes. In the multiple holes distributed at intervals, the second interconnection layer 72 is in contact with the third interconnection layer 73, thereby increasing the interconnection reliability. Meanwhile, the interval distribution reduces heat generated in the operation of the interconnection layers. Moreover, multiple holes distributed at intervals may be made in smaller size and larger density, so that the demands for interconnection of some products for specific purposes can also be met. For example, it is required that a signal led out for interconnection is a high-density and low-current signal, and corresponding holes and interconnection layers in the holes are smaller in size and larger in density.

It can be understood that it is possible to form the second interconnection layer 72 first and then form the third interconnection layer 73, or form the third interconnection layer 73 first and then form the second interconnection layer 72. It is also possible to perform the steps of forming the second interconnection layer 72 and the third interconnection layer 73 simultaneously.

The second interconnection layer 72 and the third interconnection layer 73 are conductive materials which may be copper or copper alloy. The second opening 52 and the third opening 53 may be filled in an electrocoppering manner, and subjected to chemical mechanical polishing.

Then, as shown in FIG. 1, FIG. 14 and FIG. 15, the first wafer 10 and the third wafer 30 are aligned, so that the second interconnection layer 72 comes into contact with the third interconnection layer 73 to shorten an interconnection distance between wafers, thus reducing the parasitic capacitance and the power loss, and improving the transmission speed. A second bonding interface 42 is formed by mixed bonding of metal-to-metal and dielectric layer-to-dielectric layer, and then metal ions are diffused to enhance the bonding force through a subsequent heat treatment process, so that interconnection of three layers of wafers is realized.

In conclusion, according to the multi-wafer stacking structure and method of the present invention, it is unnecessary to reserve a bonding lead space between wafers, a silicon substrate is eliminated, and the multi-wafer stacking thickness is reduced while multi-wafer interconnection is realized, so that the overall device thickness is reduced after multi-wafer stacked package, the package density is increased, more wafers are received in unit volume, and the requirements for increasingly thinning semiconductor products are met. Moreover, there is no need of leads, so as to eliminate design processing of a silicon substrate and a plurality of shared bonding pads on the silicon substrate, thereby reducing the cost and simplifying the process. Therefore, the wafer integrating capability is improved, and wafers with different functions (such as RF, Memory, Logic, Sensors, Imagers) are integrated on a package, thus providing great advantages in performance, function and size.

The above description is only the description for the preferred embodiments of the present invention and is not intended to make any limitation on the scope of the present invention.

Any changes and modifications made by those of ordinary skill in the art according to the above disclosure fall within the scope of protection of the claims.

What is claimed is:

1. A method for fabricating a multi-wafer stacking structure, comprising:
    providing a first wafer and a second wafer, the first wafer comprising a first substrate, a first dielectric layer, a first metal layer and a first isolated layer located at a back of the first substrate, the second wafer comprising a second substrate, a second dielectric layer and a second metal layer, the first dielectric layer being bonded to the second dielectric layer;
    forming a first opening, the first opening comprising a first upper opening, a first middle opening and a first lower opening, the first upper opening penetrating through a partial thickness of the first isolated layer, the first middle opening penetrating through the first isolated layer, the first substrate and a partial thickness of the first dielectric layer, the first middle opening being located above the first metal layer, the first lower opening penetrating through the first wafer and a partial thickness of the second dielectric layer, the first lower opening being located above the second metal layer, the first upper opening communicating with the first middle opening and the first lower opening respectively;
    forming a second isolated layer, the second isolated layer covering a surface of the first isolated layer and a surface of the first opening, the second isolated layer exposing part of the first metal layer and part of the second metal layer;
    forming a first interconnection layer, the first interconnection layer being electrically connected to the first metal layer and the second metal layer via the first opening;
    forming an insulating layer, the insulating layer being located on a surface of the second isolated layer and a surface of the first interconnection layer, and forming a second opening in the insulating layer, the second opening exposing part of the first interconnection layer;
    providing a third wafer, the third wafer comprising a third substrate, a third dielectric layer and a third metal layer;
    forming a third opening, the third opening penetrating through a partial thickness of the third dielectric layer and exposing part of the third metal layer, the third opening and the second opening being arranged correspondingly;
    forming a second interconnection layer and a third interconnection layer, the second interconnection layer being electrically connected to the first interconnection layer via the second opening, and the third interconnection layer being electrically connected to the third metal layer via the third opening; and
    bonding the first wafer and the third wafer, so that the second interconnection layer is electrically connected to the third interconnection layer to realize interconnection of the first wafer, the second wafer and the third wafer.

2. The method for fabricating a multi-wafer stacking structure of claim 1, wherein forming a second isolated layer comprises:
    forming a second isolated layer, the second isolated layer covering the surface of the first isolated layer and the surface of the first opening; and
    performing an etch process to etch away the second isolated layer at a bottom of the first middle opening and expose the first metal layer, and to etch away the second isolated layer at a bottom of the first lower opening and expose the second metal layer.

3. The method for fabricating a multi-wafer stacking structure of claim 1, wherein forming a first opening comprises:
    forming a first upper opening, wherein the first upper opening penetrates through the partial thickness of the first isolated layer and is located above the first metal layer and the second metal layer;
    forming a first middle opening, wherein the first middle opening penetrates through the first isolated layer, the first substrate and the partial thickness of the first dielectric layer and wherein the first middle opening is located above the first metal layer; and
    forming a first lower opening, wherein the first lower opening penetrates through the first wafer and the partial thickness of the second dielectric layer and is located above the second metal layer, the first upper opening communicating with the first middle opening and the first lower opening respectively.

4. The method for fabricating a multi-wafer stacking structure of claim 3, further comprising, after forming a first middle opening and before forming a first lower opening:
    coating a photoresist, the photoresist filling the first upper opening and the first middle opening and covering the surface of the first isolated layer; and
    forming a photoresist window located above the second metal layer by exposure and development.

5. The method for fabricating a multi-wafer stacking structure of claim 1, wherein the first interconnection layer, the second interconnection layer and the third interconnection layer are made of metal.

6. The method for fabricating a multi-wafer stacking structure of claim 5, wherein the second interconnection layer and the third interconnection layer are bonded to each other using a non-melting diffusion method after the first wafer and the third wafer are bonded.

7. The method for fabricating a multi-wafer stacking structure of claim 1, wherein after the first dielectric layer and the second dielectric layer are bonded to each other, the first wafer and/or the second wafer are thinned; and wherein after the first wafer and the third wafer are bonded, the third wafer is thinned.

\* \* \* \* \*